(12) United States Patent
Omid-Zohoor et al.

(10) Patent No.: US 6,184,108 B1
(45) Date of Patent: *Feb. 6, 2001

(54) METHOD OF MAKING TRENCH ISOLATION STRUCTURES WITH OXIDIZED SILICON REGIONS

(75) Inventors: Farrokh Omid-Zohoor, Sunnyvale; Yowjuang W. Liu, San Jose, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/967,889

(22) Filed: Nov. 12, 1997

Related U.S. Application Data

(62) Division of application No. 08/594,209, filed on Jan. 31, 1996, now Pat. No. 6,064,104.

(51) Int. Cl.⁷ .................................................. H01L 21/762
(52) U.S. Cl. ............................................ 438/431; 438/432
(58) Field of Search .................................. 438/431, 432, 438/FOR 227, 781; 148/DIG. 85, DIG. 86, DIG. 50

(56) References Cited

U.S. PATENT DOCUMENTS

| 4,139,442 | 2/1979 | Bondur et al. . |
|---|---|---|
| 4,238,278 | * 12/1980 | Antipov . |
| 4,356,211 | * 10/1982 | Riseman . |
| 4,493,740 | * 1/1985 | Komeda . |
| 4,576,834 | * 3/1986 | Sobczak . |
| 4,707,218 | * 11/1987 | Giammarco et al. . |
| 5,059,550 | 10/1991 | Takeota et al. . |
| 5,189,501 | * 2/1993 | Kawamura et al. . |
| 5,472,903 | * 12/1995 | Lur et al. . |
| 5,472,904 | 12/1995 | Figura et al. . |
| 5,492,858 | 2/1996 | Bose et al. . |
| 5,578,518 | 11/1996 | Kioke et al. . |
| 5,583,348 | 12/1996 | Sundaram . |

* cited by examiner

Primary Examiner—George Fourson

(57) ABSTRACT

A trench isolation structure in a semiconductor substrate includes a trench opening in the surface of the substrate and a seamless oxide layer filling the trench. The seamless oxide layer is formed by forming a first oxide layer in the trench, adding a silicon material overlying the first oxide layer and within a gap on the first oxide layer between the trench sidewalls that tend to be produced in the preceding step, and oxidizing the silicon material to form a second oxide layer. The deposited silicon material expands during oxidation, filling the trench opening to produce a seamless oxide fill of the trench. This seamless trench isolation structure prevents accumulation of materials that reduce the yield of the finished semiconductor product.

8 Claims, 5 Drawing Sheets

METHOD OF MAKING TRENCH ISOLATION STRUCTURES WITH OXIDIZED SILICON REGIONS

This application is a division of application Ser. No. 08/594,209 filed Jan. 31, 1996, now U.S. Pat. No. 6,064,104.

BACKGROUND OF THE INVENTION

1. Field of the Invention

The present invention relates to trench isolation structures in semiconductors and, more particularly, to trench isolation structures having oxide materials deposited within a trench.

2. Description of the Related Art

Trench isolation structures are used to isolate transistors and logic gates in high density semiconductor devices such as microprocessors, non-volatile memories, and programmable logic arrays. FIGS. 1A–1C are diagrams summarizing the formation of a conventional trench isolation structure 10 by etching a trench opening 12 into the semiconductor substrate 5 having on the substrate surface an oxide layer 7 and a silicon nitride layer 9. As shown in FIG. 1A, the trench opening 12 has sidewalls 12a and 12b and a width of approximately 0.5 micron. The conventional process then uses low pressure chemical vapor deposition (LPCVD) to deposit an oxide such as tetraethylorthosilicate (TEOS) to fill the trenches, typically by depositing a layer of oxide having a thickness of greater than half the trench width on each wall of the trench. Specifically, if the trench 12 has a width of 0.5 micron and the oxide layer 14 had a thickness of less than 0.25 micron, the deposited oxide layer 14a would form a structure having a gap 15 as shown in FIG. 1B. To avoid formation of the gap, the deposited oxide layer 14 typically has a thickness of greater than one half the trench width to form the structure in FIG. 1C.

As shown in FIG. 1C, however, a seam 16 tends to form in the trench isolation structure at the boundary where the two oxide portions 14a and 14b of the oxide layer 14 meet. Although the actual location of the seam 16 may vary depending on the relative thicknesses of the deposited oxide layer 14a and 14b, the seam 16 will form where the layers 14a and 14b meet.

Formation of the seam creates problems that will reduce the yield of the semiconductor device. For example, the seam 16 may open during manufacture, such as during planarization that involves etch-back or chemical-mechanical-polishing (CMP) processing of the oxide layer 14. Etch-back of the deposited oxide layer 14 causes the upper end of the seam 16 to open at a faster rate, resulting in a "V" formation that can collect materials deposited during fabrication. Accelerated etching of the seam 16 may also create electrically conductive stringers formed from subsequently deposited materials such as polysilicon, metal or silicide. These stringers cannot be removed because the deposited material is embedded in the "V" formation. Thus, the stringers can cause shorts between poly and metal lines and therefore reduce the product yield.

DISCLOSURE OF THE INVENTION

There is a need for a trench isolation structure that provides a seamless oxide layer filling the trench opening of a trench isolation structure.

There is also a need for a trench isolation structure that improves product yield by freedom from those defects typically carried by etched seams and deposited oxide layers.

There is also a need for a trench isolation structure having no seam defects between oxide layers within the trench opening.

These and other needs are achieved by the present invention, wherein a trench isolation structure in a semiconductor substrate includes a trench opening and a seamless oxide region filling the trench. The trench isolation structure includes a first oxide layer overlying the bottom and sidewalls of the trench and forming a gap within the trench. A second oxide layer filling the gap is formed from oxidation from silicon deposited within the gap. The surface of the trench isolation structure which results is free from seams, and thus prevents the introduction of impurities such as polysilicon or silicide during subsequent fabrication of semiconductor circuits.

According to the present invention, a method of forming a trench isolation structure in a semiconductor substrate comprises the steps of: forming a silicon nitride mask overlying the semiconductor substrate such that the silicon nitride mask has an exposed portion corresponding to the location of a trench to be etched; etching a trench opening in the semiconductor substrate at the exposed portion; forming a first oxide layer that covers the bottom and side surfaces of the trench opening and with a gap exposed within the trench opening; adding silicon material to the gap; and heating the silicon material to form a second oxide layer, the second oxide layer upon formation expanding to fill the gap.

The first oxide layer overlying the bottom and sidewalls of the trench provides stress relief for the sidewalls during formation of the second oxide layer. Thus, the present invention provides a trench isolation structure with an oxide region having a seamless surface filling the trench, thereby preventing the formation of stringers.

The present invention also provides the use of spacers formed within exposed portions of the nitride mask before etching of the trench. Hence, the trench has a width that is narrower than the width of the exposed portions of the nitride mask. Thus, the use of spacers is particularly effective in overcoming limitations of conventional masking techniques, such as photolithography.

These and other advantages of the present invention will become more readily apparent upon review of the attached drawings and the accompanying detailed description of the best mode for carrying out the invention.

BRIEF DESCRIPTION OF DRAWINGS

Reference is made to the attached drawings, wherein elements having, the same reference numeral designations represent life elements throughout, and wherein.

BEST MODE FOR CARRYING OUT THE INVENTION

According to the present invention, a trench isolation structure comprises a semiconductor substrate having a trench opening, and a seamless oxide region filling the trench. The seamless oxide region includes a first oxide layer overlying the bottom and sidewalls of the trench and forming a gap exposed to the surface of the trench, and a second oxide layer filling the gap. As described below, the second oxide layer is formed from silicon deposited within the gap formed by the first oxide layer. Oxidation of the deposited silicon causes the resulting second oxide layer to expand and fill the gap. The first oxide layer advantageously includes stress relief properties to accommodate expansion of the second oxide layer, contracting to accommodate expansion of the second oxide layer. Thus, the resulting oxide region is formed without stress regions in the oxide region or the sidewalls of the trench.

Figure 1A:
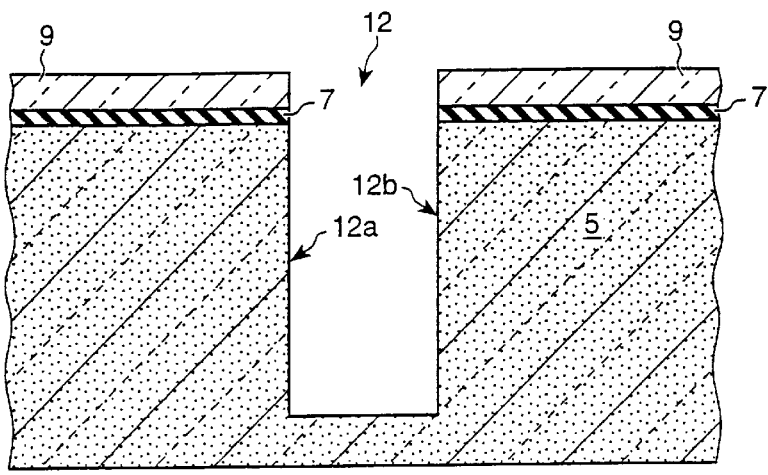
FIGS. 1A, 1B and 1C are diagrams summarizing formation of a conventional trench isolation structure.
Figure 1B:
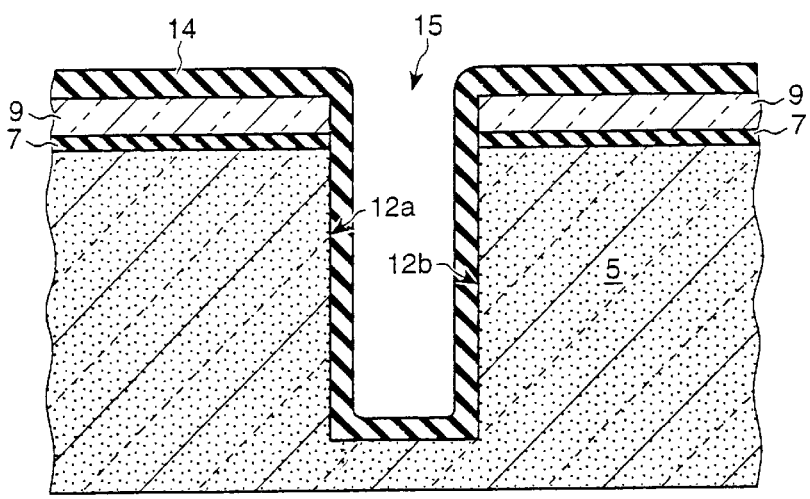
Figure 1C:
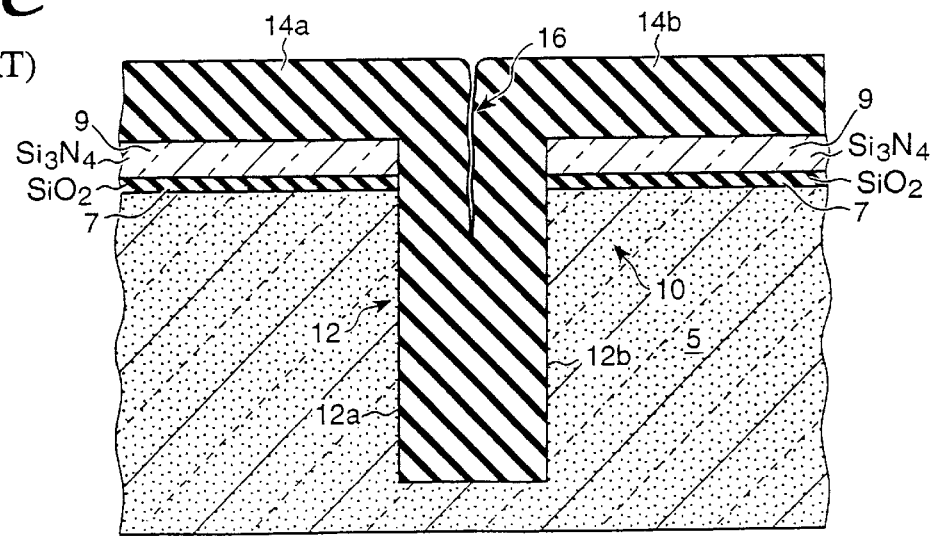
Figure 2:
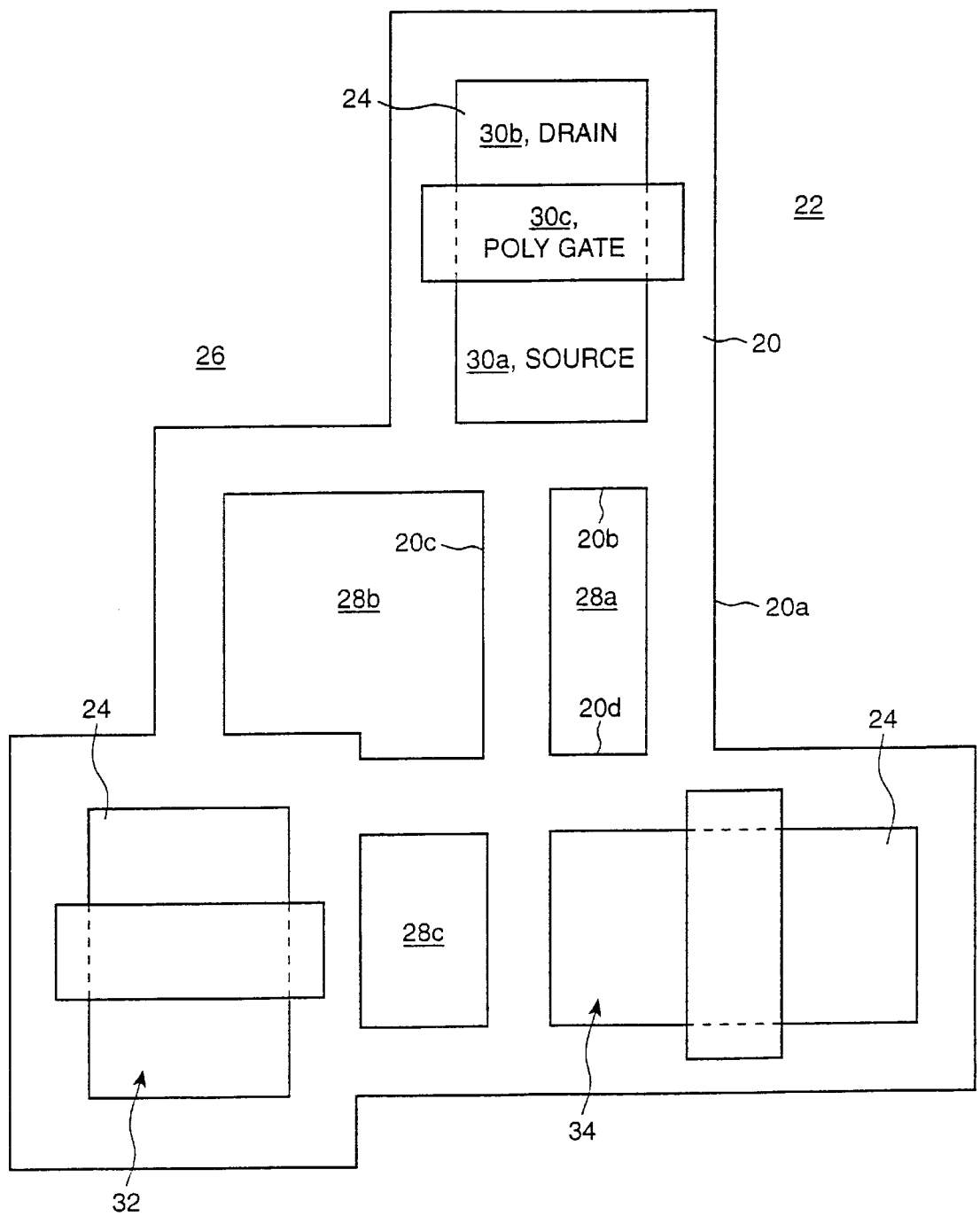
FIG. 2 is an illustration of a semiconductor region having a plurality of trench isolation structures formed according to the present invention.

FIG. 2 is a plan view illustrating an application of the trench isolation structure of the present invention in a semiconductor. As shown in FIG. 2, a plurality of trench isolation structures 20 are arranged on a semiconductor 22 to define active regions 24, inactive regions 26, and inactive field regions 28 comprising, in this example, regions 28a, 28b, and 28c.

According to the preferred embodiment, each of the isolating field areas on the semiconductor substrate surface is set to a minimum width corresponding to a predetermined maximum width W of the isolation trench structures 20, for example, W=0.5 micron. Thus, if an isolating field area is needed that has a width greater than the maximum width W of the trench isolation structure, the isolating field area is defined by an inactive field region 28a, b or c formed by trench structures that enclose the inactive field region 28. For example, the inactive field region 28a is defined by the surrounding trench structures 20a, 20b, 20c and 20d. As shown in FIG. 2, the trench isolation structure may include a border trench such as trench 20a and a dummy trench 20c that divides an isolating field area. For example, trench 20c divides an isolating field area into field regions 28a and 28b.

Hence, the trench isolation structures can be used to isolate the active areas 24 of different transistor regions. For example, the trench isolation structure 20 isolates an active region 24 of a transistor 30 having a source region 30a, a drain region 30b, and a gate region 30c from transistors 32 and 34.

A method for forming the trench isolation structure according to a preferred embodiment of the present invention will now be described with reference to FIGS. 3A–3N.

Figure 3A:
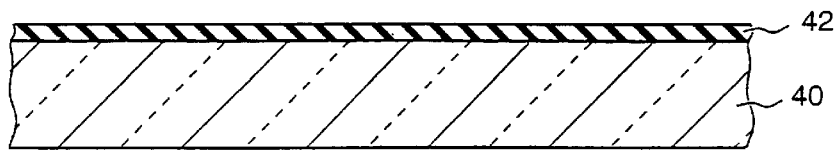
FIGS. 3A–3N are sequence diagrams summarizing a method for forming the trench isolation structure according to a preferred embodiment of the present invention.

As shown in FIG. 3A, a semiconductor substrate 40 such as silicon has a layer of pad oxide 42 grown thereon to a thickness of approximately 100–250 Å. As described below, the pad oxide layer 42 is used to reduce the stress between a nitride mask formed on the pad oxide layer 42 and the semiconductor substrate 40. The pad oxide layer 42 is typically grown at between 850° and 1000° C.

Figure 3B:
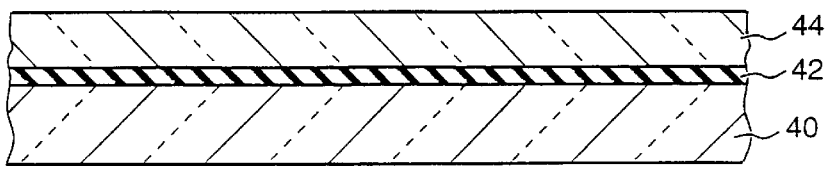
Figure 3C:
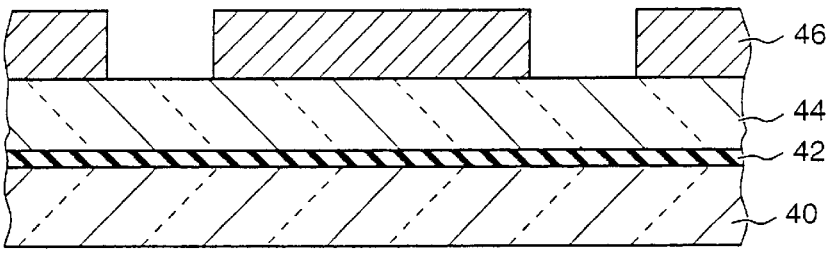

A layer of silicon nitride 44 having a thickness of approximately 1700 Å, shown in FIG. 3B, is then deposited on the pad oxide layer 42 using, for example, a low pressure chemical vapor deposition (LPCVD) technique in a deposition chamber. The field regions shown in FIG. 2 are then defined by performing a masking operation on the silicon nitride layer 44 defining the location of the isolation trench structures 20. Specifically, a photoresist layer 46 is deposited on the silicon nitride layer 44 and etched to expose regions of the silicon nitride layer 44 to be etched as part of the trench opening. Thus, the photoresist mask 46 shown in FIG. 3C will define a silicon nitride mask for etching the necessary trench openings in the semiconductor substrate for the trench isolation regions.

Figure 3D:
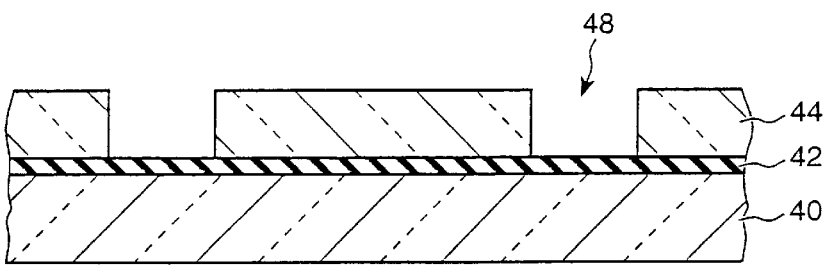

After formation of the photoresist mask 46, the silicon nitride layer 44 is etched using a dry etch, and the photoresist layer 46 is then stripped resulting in the structure shown in FIG. 3D. The etched silicon nitride layer 44 includes exposed regions 48 corresponding to the areas in the silicon substrate 40 to be etched to form the trench structure 20. An oxide etch is then performed to remove the portions of the pad oxide layer that are exposed by the nitride mask.

Figure 3E:
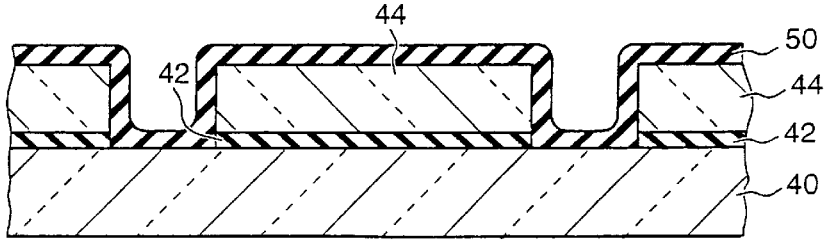

A spacer oxide layer 50 is deposited over the silicon nitride layer 44 as shown in FIG. 3E to a thickness of between 500–1000 Å. The spacer oxide layer 50 is then selectively etched using a conventional oxide etch in order to form the sidewall spacers 52 shown in FIG. 3F.

Figure 3F:
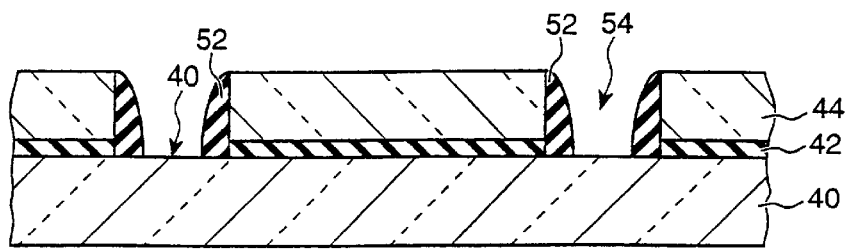

Formation of the sidewall spacers 52 as shown in FIGS. 3E and 3F is optional, but is particularly advantageous to overcome limitations of masking using photolithography. In particular, if photolithography is used, there may arise a situation where a photoresist line cannot be defined for widths of less than 0.5 micron. By using a spacer 52, however, a trench 54 having a width of less than 0.5 micron can be etched by use of the spacers 52 formed within the exposed regions 48 of nitride mask 44. Thus, the use of spacers 52 enables the formation of an exposed silicon etch region 54 having a width that is smaller than the exposed nitride mask portion 48. This is particularly effective when the width of the exposed regions 48 of the nitride mask 44 is not sufficiently small to accomodate the width W of the trench formed in the semiconductor substrate 40.

Figure 3G:
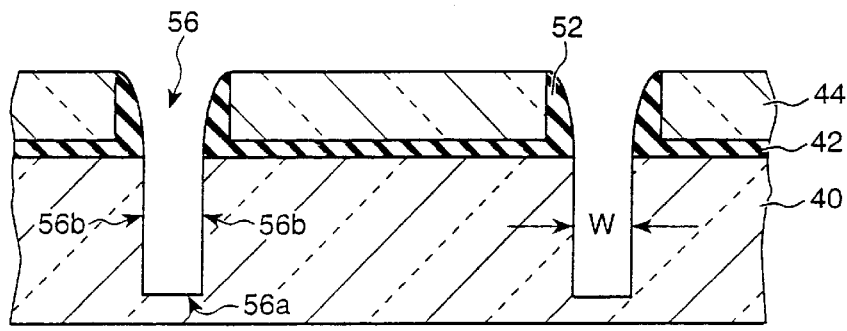

Upon formation of the nitride mask 44 and the optional spacers 52, the exposed silicon etch regions 54 are etched using, for example, a dry etch to form trench openings 56 in the semiconductor substrate 40, shown in FIG. 3G. The trench opening 56 includes a bottom 56a and sidewalls 56b. The surface of the insulating spacers 52 coincide with the sidewalls 56b of the trench at the surface of the semiconductor layer 40.

Figure 3H:
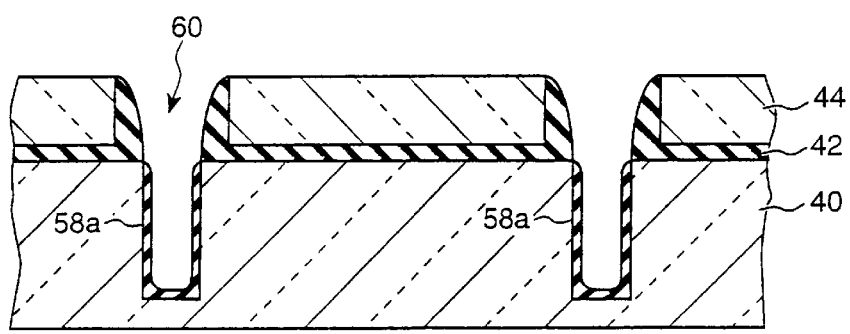

After formation of the trench opening 56, a first oxide layer 58 overlying the bottom 56a and sidewalls 56b of the trench 56 is formed as shown in FIG. 3H. According to the preferred embodiment, the first oxide layer 58 can be formed by two alternative techniques, namely by growing an oxide layer (FIG. 3H), or by depositing a layer of oxide (FIG. 3I).

According to the first technique shown in FIG. 3H, a first oxide layer 58a is grown at a high temperature by oxidizing the bottom 56a and sidewalls 56b of the trench in the semiconductor substrate 40 to form an oxide layer having a thickness of about 500–1000 Å. The grown high is temperature oxide layer 58a rounds out the top corners of the trench. Thus, the curved edges formed by the first oxide layer 58a at the top of the trench 56 provide beneficial distribution of compressive stresses during subsequent oxidation of silicon during filling of the gap 60.

Figure 3I:
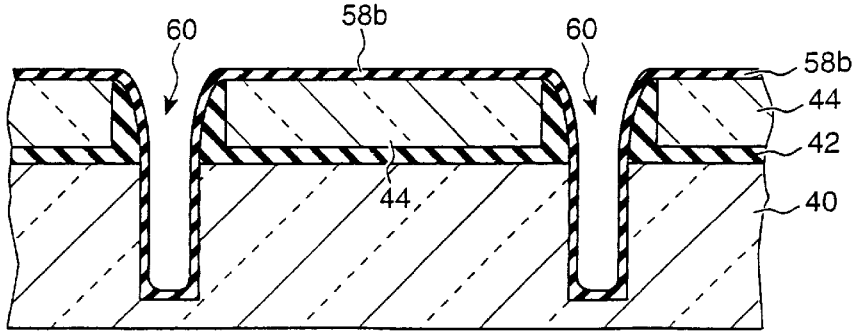

Alternatively, the first oxide layer 58 may be formed in the trench 56 by depositing an oxide layer 58b, such as TEOS, having a thickness of about 500–1000 Å, as shown in FIG. 3I. Preferably, LPCVD techniques are used to deposit the oxide layer 58b to the trench 56. Depositing of the oxide layer 58b results in formation of a gap 60. As discussed below, the deposited oxide layer 58b provides stress relief for the sidewalls during formation of a second oxide layer by contracting to accommodate expansion of the second oxide layer.

Figure 3J:
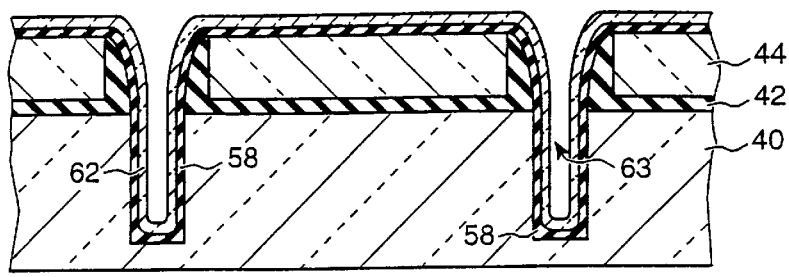

After formation of the first oxide layer 58 as shown in either FIG. 3H or 3I, the gap 60 is filled by adding a layer of silicon material 62 to the gap 60, and then heating the added silicon layer 62 to form a second oxide layer. Specifically, a silicon layer such as polysilicon or amorphous silicon is deposited over the gap 60 and the nitride mask 44 to a thickness that is less than one half the width of the gap 60, as shown in FIG. 3J. The thickness of the deposited silicon layer 62 is determined on the basis of the thickness of the first oxide layer and the width W of the trench 56, such that there still remains sufficient room to accommodate volume expansion of the deposited silicon layer 62 upon total oxidation thereof. However, the thickness of the deposited silicon layer 62 should not so much as to fill the gap 63 before total oxidation occurs. Thus, the the closing of the gap 63 occurs upon total oxidation of the deposited silicon. If desired, the deposited silicon layer 62 may also be doped.

Although the deposited silicon layer 62 is preferably deposited polysilicon or amorphous silicon, other silicon gels or silicates having a porous nature and that can be converted to silicon dioxide after subsequent heat treatment and/or oxidation steps may be used for the deposited layer 62.

After the silicon layer 62 has been deposited within the gap 60 within the trench 56, the added silicon material is heated at a high temperature to oxidize the deposited silicon layer 62. As recognized in the art, the deposited silicon layer 62 expands upon oxidation to fill the gap 60 and the trench 56. As described above, the first oxide layer 58 provides stress relief for the sidewalls 56b of the trench 56 by rounding out the top edges of the trench 56. In addition, the use of the deposited oxide layer 58b results in a contraction of the deposited oxide layer 58b to partially accommodate the expansion of the silicon layer 62.

Figure 3K:
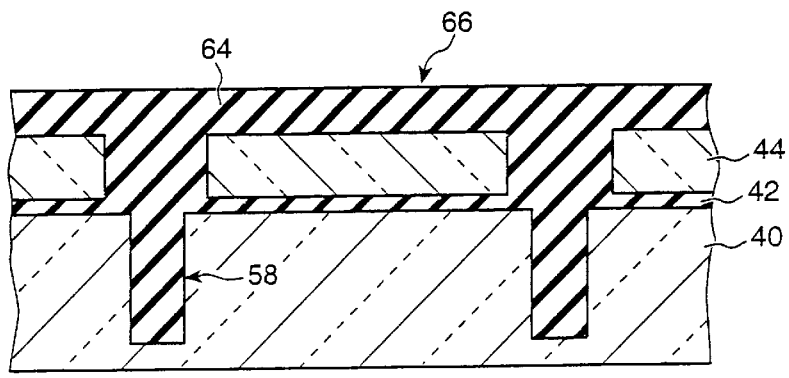

Upon completing the heating of the deposited silicon layer 62, a second oxide layer is formed filling the gap and extending above the nitride mask 44, as shown in FIG. 3K. Since the expansion of the second oxide layer 64 is limited by the first oxide layer 58 and any spacers 52 that may be present, the second oxide layer 64 fills in the trench to form a seamless oxide region filling the trench in combination with the first oxide layer and the spacer oxides. Thus, the first oxide layer 58, the spacer oxides 52 and the second layer oxide 64 integrate to form a common oxide region 66. The trench is filled with an oxide region without formation of seams that may otherwise generate stringers during subsequent processing.

Figure 3L:
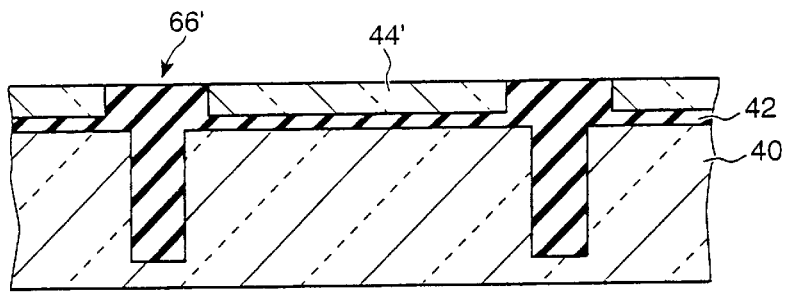
Figure 3M:
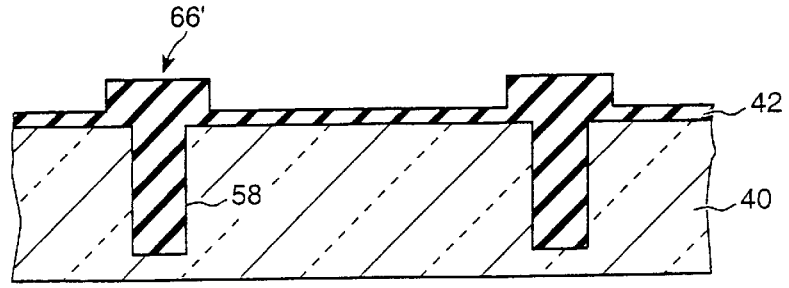

After formation of the second oxide layer 64 as shown in FIG. 3K, the silicon nitride mask 44 and the oxide region 66 are partially removed by polishing away up to one half the depth of the silicon nitride mask 44. As shown in FIG. 3L, the silicon nitride mask 44, which typically has a thickness of 1,700 Å, is polished back to a thickness of approximately 700 Å to provide the polished mask 44' shown in FIG. 3L.

After the nitride layer mask 44 and the oxide region 66 have been polished to form the polished mask 44' and the oxide region 66', the remaining nitride layer 44' is stripped using a conventional nitride strip process. The nitride strip process exposes the pad oxide layer 42 and the expanded portion of the oxide region 66'. The pad oxide layer 42 and the oxide region 66' are then etched in order to provide the final trench isolation structure 70 having the etched oxide region 68 shown in FIG. 3N. The trench isolation structure is then ready for additional fabrication processes, such as a standard CMOS process.

Figure 3N:
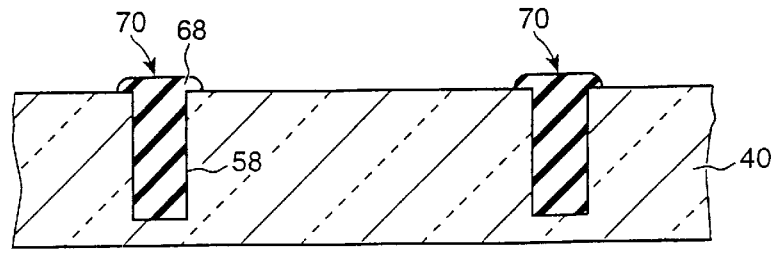

A particular advantage of the structure of FIG. 3N is that the surface of the semiconductor substrate 40 is smooth after formation of the isolation structures 70. Specifically, the addition of the pad oxide layer 42 provides a stress relief layer for cushioning between the semiconductor substrate layer 40 and the silicon nitride layer 44. Silicon nitride has a crystalline structure that is substantially different from that of silicon. If the silicon nitride layer 44 were added directly on top of the silicon layer 40, the resulting pressure or stress on the surface of the silicon semiconductor layer 40 would create a rough, pitted surface once the silicon nitride layer 44 was removed. The use of the pad oxide layer 42 prevents pressure buildup on the silicon surface by providing a stress relief layer.

Thus, the present invention provides trench isolation structures having a seamless oxide region filling the trench, thereby improving yield during fabrication. Although the disclosed arrangement is used with a silicon substrate, it will be appreciated that the present invention may be applicable in semiconductor substrates of other materials.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A method of forming a trench isolation stricture in a semiconductor substrate, comprising the steps of:

forming a trench opening in the semiconductor substrate;

forming a first oxide layer on bottom and side surfaces of the trench opening, leaving a gap in the first oxide layer that is exposed to the substrate surface;

partially filling the gap with a silicon material, wherein the partially filling step comprises depositing porous silicate as the silicon material; and heating the silicon material to form a second oxide layer expanding to fully fill the gap.

2. A method as in claim 1, further comprising the steps of:

forming a silicon nitride mask overlying the semiconductor substrate, the silicon nitride mask having an exposed portion corresponding to a location of the trench opening;

forming a pad oxide layer on the semiconductor substrate before the silicon nitride mask forming step, the silicon nitride mask overlying said pad oxide layer;

removing the silicon nitride mask after said heating step; and selectively etching said pad oxide layer.

3. A method as in claim 2, wherein the silicon nitride mask removing step comprises the steps of:

(1) removing up to a half of the silicon nitride mask by polishing; and (2) stripping the polished nitride mask.

4. A method as in claim 2, further comprising forming a spacer comprising the steps of:

depositing an oxide layer on the silicon nitride mask; and selectively etching the deposited oxide layer to form a spacer at an edge of the exposed portion of the silicon nitride mask, the side surfaces of the trench opening coinciding with a surface of the spacer.

5. A method as in claim 1, wherein the first oxide layer forming step comprises the step of heating the trench opening to form an oxide layer on the bottom and side surfaces of the trench.

6. A method as in claim 1, wherein the first oxide layer fanning step comprises the step of performing low pressure chemical vapor deposition of tetraethylorthosilicate (TEOS).

7. A method as in claim 1, wherein the heating step includes completely oxidizing the silicon material to Form the second oxide layer.

8. A method as in claim 1, wherein the heating step includes heating the silicon material to form a second oxide layer as a seamless layer.

* * * * *

UNITED STATES PATENT AND TRADEMARK OFFICE
CERTIFICATE OF CORRECTION

PATENT NO. : 6,184,108 B1
DATED : February 06, 2001
INVENTOR(S) : Farrokh Omid-Zohoor, et al.

Page 1 of 1

It is certified that error appears in the above-identified patent and that said Letters Patent is hereby corrected as shown below:

<u>CLAIMS</u>:

<u>Claim 6</u>,
Line 2, change "fanning" to -- forming --;

<u>Claim 7</u>,
Line 2, change "Form" to -- form --.

Signed and Sealed this

Fourteenth Day of August, 2001

*Attest:*

*Nicholas P. Godici*

*Attesting Officer*

NICHOLAS P. GODICI
*Acting Director of the United States Patent and Trademark Office*